US 9,895,879 B2

(12) United States Patent
Fujii et al.

(10) Patent No.: US 9,895,879 B2
(45) Date of Patent: Feb. 20, 2018

(54) SEMICONDUCTOR DEVICE AND RECORDING DEVICE

(71) Applicant: CANON KABUSHIKI KAISHA, Tokyo (JP)

(72) Inventors: Kazunari Fujii, Tokyo (JP); Toshio Negishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/383,513

(22) Filed: Dec. 19, 2016

(65) Prior Publication Data
US 2017/0173943 A1    Jun. 22, 2017

(30) Foreign Application Priority Data

Dec. 21, 2015 (JP) ................. 2015-249092

(51) Int. Cl.
| | |
|---|---|
| *B41J 2/045* | (2006.01) |
| *H02H 9/04* | (2006.01) |
| *H01L 23/525* | (2006.01) |
| *H01L 23/60* | (2006.01) |
| *H01L 27/02* | (2006.01) |
| *B41J 2/35* | (2006.01) |
| *B41J 2/375* | (2006.01) |

(52) U.S. Cl.
CPC ....... *B41J 2/04541* (2013.01); *B41J 2/04586* (2013.01); *H01L 23/5252* (2013.01); *H01L 23/60* (2013.01); *H01L 27/0266* (2013.01); *H02H 9/045* (2013.01); *B41J 2/35* (2013.01); *B41J 2/375* (2013.01)

(58) Field of Classification Search
CPC ................ B41J 2/04541; B41J 2/04586; B41J 2/04588; B41J 2/3558; B41J 2/375; H01L 23/5252; H01L 23/60; H01L 27/0266; H02H 9/045
See application file for complete search history.

(56) References Cited

U.S. PATENT DOCUMENTS

| 6,255,893 B1 * | 7/2001 | Dishongh .......... G01R 31/3004 327/525 |
| 6,945,622 B2 | 9/2005 | Sakurai |
| 9,144,978 B2 * | 9/2015 | Ohmura ............... B41J 2/14016 |

FOREIGN PATENT DOCUMENTS

JP    2014-58130 A    4/2014

* cited by examiner

*Primary Examiner* — Thinh H Nguyen
(74) *Attorney, Agent, or Firm* — Canon U.S.A., Inc. IP Division

(57) ABSTRACT

A semiconductor device includes, an anti-fuse element, a transistor connected via the anti-fuse element to a power source terminal which may apply a voltage to the anti-fuse element, an ESD protection element connected to the power source terminal via a node, and a first resistive element disposed in an electric path between the node and the anti-fuse element, wherein resistance of the first resistive element increases with an increase of a voltage applied to the first resistive element.

22 Claims, 12 Drawing Sheets

SEMICONDUCTOR DEVICE AND RECORDING DEVICE

BACKGROUND

Field of the Disclosure

An aspect of the present disclosure relates to a semiconductor device or a recording device, including an anti-fuse element.

Description of the Related Art

In recent years, a One Time Programmable (OTP) memory for recording product-specific information after the completion of a product, such as a chip identification (ID) and setting parameters, has been employed in a semiconductor device. There are two different types of OTP memories: a fuse element and an anti-fuse element. A conventional technique using an anti-fuse element is discussed in Japanese Patent Application Laid-Open No. 2014-58130.

SUMMARY

In the above-described semiconductor device, if an enormous surge current enters an anti-fuse memory due to electro-static discharge (ESD), information recorded in the memory is altered.

According to an aspect of the present disclosure, a semiconductor device includes, an anti-fuse element, a transistor connected, via the anti-fuse element, to a power source terminal which may apply a voltage to the anti-fuse element, an ESD protection element connected to the power source terminal via a node, and a first resistive element disposed in an electric path between the node and the anti-fuse element. A resistance value of the first resistive element increases with an increase of a voltage applied to the first resistive element.

According to another aspect of the present disclosure, a semiconductor device includes, an anti-fuse element, a transistor of which either one of a source and a drain is connected to one terminal of the anti-fuse element and the other one of the source and the drain is supplied with a first potential, a first resistive element of which one terminal is connected to the other terminal of the anti-fuse element and the other terminal is connected to a power source terminal supplied with a second potential different from the first potential, and an ESD protection element connected to an electric path between the power source terminal and the other terminal of the first resistive element. The first resistive element is a diffusion resistor.

According to yet another aspect of the present disclosure, a semiconductor device includes, an anti-fuse element, a transistor of which either one of a source and a drain is connected to one terminal of the anti-fuse element and the other one of the source and the drain is supplied with a first potential, a first resistive element of which one terminal is connected to the other terminal of the anti-fuse element and the other terminal is connected to a power source terminal supplied with a second potential different from the first potential, and an ESD protection element connected to an electric path between the power source terminal and the other terminal of the first resistive element. A resistance value of the first resistive element increases with an increasing voltage applied to the first resistive element.

According to yet another aspect of the present disclosure, a recording device includes, a recording head unit having a plurality of discharge nozzles and a recording head substrate, and an ink tank attached to the recording head unit. The recording head substrate includes, heaters disposed to respectively correspond to the plurality of discharge nozzles, a control circuit electrically connected to the heaters, and any one of the above-described semiconductor devices electrically connected to the control circuit.

Further features of the present disclosure will become apparent from the following description of exemplary embodiments with reference to the attached drawings.

DESCRIPTION OF THE EMBODIMENTS

Figure 1:
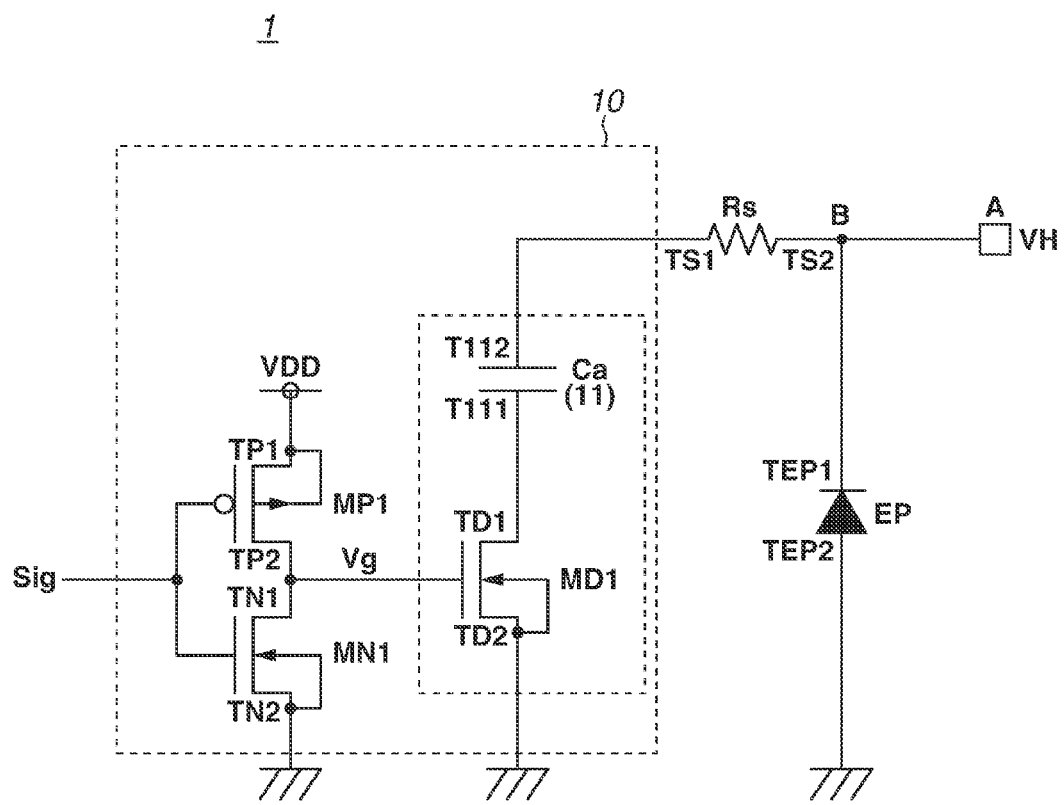
FIG. 1 illustrates an example of a circuit of a semiconductor device according to a first exemplary embodiment in accordance with one or more aspect of the present disclosure.

A first exemplary embodiment of the present disclosure will be described below. FIG. 1 illustrates a circuit configuration of a semiconductor device according to one or aspect of a first exemplary embodiment of the present disclosure in a state before information is written in an anti-fuse element.

The semiconductor device according to the present exemplary embodiment includes a memory unit 10 (including a first transistor MP1, a second transistor MN1, a third transistor MD1, and an anti-fuse element 11), a power source terminal A, and an electro-static discharge (ESD) protection element EP. Since information has not been written in the anti-fuse element, the anti-fuse element 11 is denoted by a capacitance Ca.

The first transistor MP1 is a P-type transistor, and the second transistor MN1 is an N-type transistor. A control signal Sig is input to the gate of the first transistor MP1 and the gate of the second transistor MN1. A first terminal $T_{P1}$ of the first transistor MP1 is connected to a logic power voltage VDD, and a second terminal $T_{P2}$ thereof is connected to a first terminal $T_{N1}$ of the second transistor MN1 and the gate of the third transistor MD1. A second terminal $T_{N2}$ of the second transistor MN1 is connected to a ground wire GND.

The third transistor MD1 is a high-voltage transistor and controls the voltage application to the anti-fuse element 11. A first terminal $T_{D1}$ of the third transistor MD1 is connected to a first terminal $T_{111}$ of the anti-fuse element 11, and a second terminal $T_{D2}$ of the third transistor MD1 is connected to the ground wire GND. A second terminal $T_{112}$ of the anti-fuse element 11 is connected to a first terminal $T_{S1}$ of a resistive element Rs. A high-voltage transistor refers to a transistor formed so as not to break down even if such a high voltage that cannot be endured by typical transistors in a logic circuit, such as a control unit, is applied.

The power source terminal A is a pad for electrically connecting the memory unit 10 and an external element, and is a terminal for applying a voltage to the anti-fuse element 11. The power source terminal A is connected to a first terminal $T_{EP1}$ of the ESD protection element EP via a node B, and a second terminal $T_{EP2}$ of the ESD protection element EP is connected to the ground wire GND. The resistive element Rs is provided on an electric path (a current path when a voltage is supplied from the power source terminal A to the anti-fuse element 11) between the anti-fuse element 11 and the node B. The first terminal $T_{S1}$ of the resistive element Rs is connected to the second terminal $T_{112}$ of the anti-fuse element 11, and a second terminal $T_{S2}$ of the resistive element Rs is connected to the node B.

Therefore, the third transistor MD1 is connected to the power source terminal A via the anti-fuse element 11. Either one of the source and the drain of the third transistor MD1 is connected to one terminal of the anti-fuse element 11. A first potential (i.e., ground potential herein) is supplied to the other one of the source and the drain of the third transistor MD1. A second terminal $T_{S2}$ of the resistive element Rs is connected, via the node B, to the power source terminal A to which a second potential different from the first potential is supplied (herein, the second potential is higher than the first potential).

A semiconductor device using an anti-fuse element as a memory records information depending on a conducting state or a non-conducting state of the anti-fuse element. In such a semiconductor device, ESD may cause an enormous surge current to enter the semiconductor device from the power source terminal A. In that case, the anti-fuse element 11 turns on, and the information recorded on the semiconductor device using the anti-fuse element 11 may be changed.

More specifically, since an extremely large surge voltage in comparison with the normal write-in and read-out voltages is applied to the anti-fuse element 11 due to ESD, the anti-fuse element 11 which is not intended to be turned on may turn on. This may change the information recorded on the semiconductor device.

To protect against ESD, the ESD protection element EP is provided between the power source terminal A and the anti-fuse element 11. In this case, providing the resistive element Rs between the node B (at which the power source terminal A and the ESD protection element EP are connected) and the anti-fuse element 11 prevents a current from easily flowing in the electric path between the power source terminal A and the anti-fuse element 11. This allows a surge current (a large current) to easily flow in the ESD protection element EP, enabling more effectively protecting the anti-fuse element 11 from the surge current due to ESD.

On the other hand, if a high voltage VH is applied to write information in the anti-fuse element 11 or if the conducting and the non-conducting states of the anti-fuse element 11 are to be detected to read information, it is desirable that the influence of the resistive element Rs is small.

It is desirable to use as the resistive element Rs a resistive element of which the resistance value has a positive voltage dependency (i.e., the resistance value increases as voltage applied to the resistive element Rs increases). When such a resistive element is used, the resistance value of the resistive element Rs becomes larger in a case where a surge voltage due to ESD is applied to the semiconductor device 1 compared to that at the time of normal operations (write and read operations) of the anti-fuse element 11.

Accordingly, in a case where a current remarkably larger than that in normal operations flows in the semiconductor device 1 due to a surge current, the resistance of the resistive element Rs increases. This prevents a current from flowing from the power source terminal A to the anti-fuse element 11. Therefore, in comparison with the case of normal operations, it is possible to prevent to a further extent a current from entering the anti-fuse element 11, allowing a larger amount of current to flow into the ESD protection element EP.

On the other hand, the resistance value of the resistive element Rs under the voltage at the time of normal operations is smaller than that at the time of surge voltage application. Therefore, a current easily flows through the electric path between the power source terminal A and the anti-fuse element 11, resulting in a decreased influence of the resistive element Rs on write and read operations for the anti-fuse element 11.

Therefore, it becomes possible to effectively protect information recorded on the anti-fuse element 11 while reducing the adverse effect when information is written into and read from the anti-fuse element 11 at the time of normal operations. A specific configuration of the semiconductor device 1 will be described below with reference to FIG. 1. The first transistor MP1 may be, for example, a p-channel metal-oxide semiconductor (PMOS) transistor constituting a low-voltage logic circuit. The second transistor MN1 may be, for example, an n-channel metal-oxide semiconductor (NMOS) transistor constituting a low-voltage logic circuit.

In the present exemplary embodiment, the low-voltage logic circuit refers to a logic circuit in which the breakdown voltages of the first transistor MP1 and the second transistor MN1 are lower than the breakdown voltage of the high-voltage transistor MD1. This does not mean a low-voltage logic circuit having a lower breakdown voltage than a normal logic circuit. The source and back gate of the first transistor MP1 are connected to the logic power voltage VDD. The source and back gate of the second transistor MN1 are connected to the ground wire GND. As described above, the control signal Sig is input to the gate of the first transistor MP1 and the gate of the second transistor MN1. The drain of the first transistor MP1 is connected to the drain of the second transistor MN1. The first transistor MP1 and the second transistor MN1 form an inverter circuit.

An output signal Vg of the inverter circuit is input to the gate of the third transistor MD1 that controls writing to the anti-fuse element 11. The third transistor MD1 may be, for example, a high-voltage NMOS transistor. The source and back gate of the third transistor MD1 are connected to the ground wire GND, and the drain thereof is connected to the first terminal of the capacitance Ca, i.e., an anti-fuse element. The second terminal of the capacitance Ca is connected to the first terminal of the resistive element Rs. The second terminal of the resistive element Rs is connected to the power source terminal A. The power source terminal A is supplied with the high voltage VH which is to be applied at the time of information writing. The cathode side of the diode (ESD protection element EP) is connected to the electrical path between the resistive element Rs and the power source terminal A, and the anode side thereof is connected to the ground.

The ESD protection element EP is configured to have a breakdown voltage higher than the voltage VH to be applied to the power source terminal A at the time of information writing.

Figure 2:
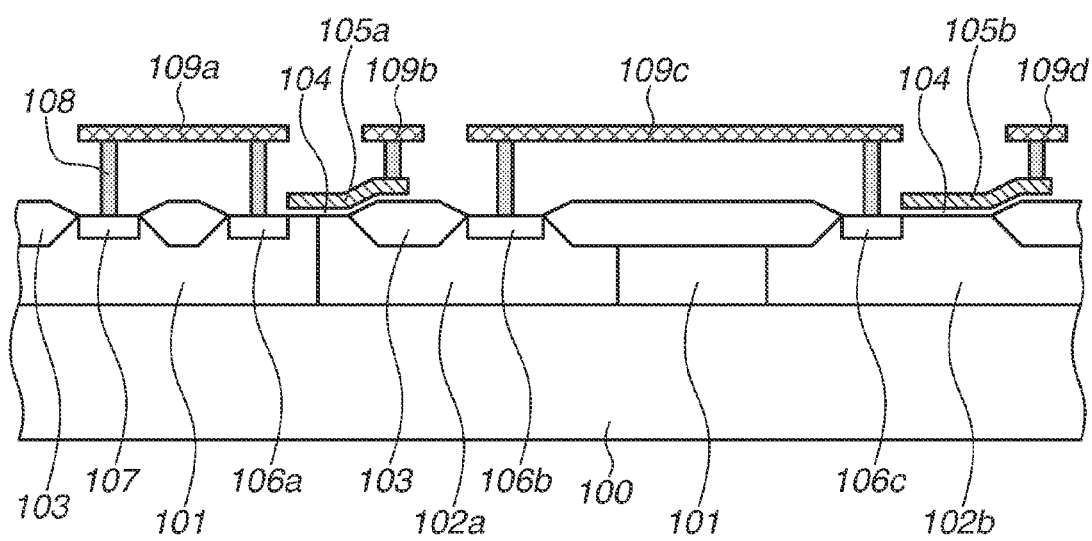
FIG. 2 is a sectional view illustrating a portion of the semiconductor device surrounded by a broken line illustrated in FIG. 1 in accordance with one or more aspect of the present disclosure.

FIG. 2 is a sectional view illustrating a portion surrounded by a broken line illustrated in FIG. 1.

A P-well region 101 and N-well regions 102a and 102b are formed on a P-type silicon substrate 100. The P-well region 101 can be formed in the same process as a P-well region of an NMOS transistor which constitutes a low-voltage logic circuit is formed. The N-well regions 102a and 102b can be formed in the same process as an N-well region of a PMOS transistor which constitutes a low-voltage logic circuit is formed.

The impurity concentrations of the N-well regions with respect to the P-type silicon substrate 100 are such that the breakdown voltages of the N-well regions 102a and 102b with respect to the P-type silicon substrate 100 are higher than the high voltage VH. The impurity concentration of the P-well region 101 with respect to the N-well regions 102a and 102b is such that the breakdown voltage of the P-well region 101 with respect to the N-well regions 102a and 102b is higher than the high voltage VH.

A field oxide film 103 having the Local Oxidation of Silicon (LOCOS) structure, high concentration N-type diffusion regions 106a to 106c, and a high concentration P-type diffusion region 107 are formed in the P-well region 101 and the N-well regions 102a and 102b.

A configuration of the third transistor MD1 which is a high-voltage NMOS transistor will be described below. A gate electrode 105a is disposed on the adjacent P-well region 101 and N-well region 102a via a gate oxide film 104. A region where the P-well region 101 overlaps with the gate electrode 105a serves as a channel region.

The high-concentration N-type diffusion region 106a is a source electrode of the third transistor MD1, and the high concentration P-type diffusion region 107 is a back gate electrode of the third transistor MD1. The N-well region 102a has a portion extending under the gate electrode 105a as a drain's field relaxing region. A high concentration N-type diffusion region 106b formed in the N-well region 102a serves as the drain electrode of the third transistor MD1. Further, the drain side of the gate electrode 105a has the LOCOS offset structure in which the drain side overrides the field oxide 103 formed in the N-well 102.

Thus, even if the voltage of the drain electrode rises to the high voltage VH in a state where the third transistor MD1 is OFF, i.e., the potential of the gate electrode is a ground potential (GND potential), a gate-drain breakdown voltage can be ensured.

The structure of the anti-fuse element 11 will be described below. The anti-fuse element 11 has an upper electrode (first electrode), a lower electrode (second electrode), and an insulating layer between these electrodes. For example, an electrode 105b disposed on the N-well region 102b via the gate oxide film 104 functions as the upper electrode (first electrode) of the anti-fuse element 11. A portion of the N-well region 102b which connects to the high concentration N-type diffusion region 106c and overlaps with the upper electrode in plan view functions as the lower electrode (second electrode) of the anti-fuse element 11.

Although, in the example illustrated in FIG. 2, the high concentration N-type diffusion region 106c is formed only in a region, of the N-well region 102b, which does not overlap with the upper electrode, the high concentration N-type diffusion region 106c is not limited thereto. For example, the high concentration N-type diffusion region 106b may be formed on a part or whole of the portion overlapping with the upper electrode. If the high concentration N-type diffusion region 106c is also formed in a region which overlaps with the upper electrode in plan view, the overlapping portion of the high concentration N-type diffusion region 106c also functions as the lower electrode of the anti-fuse element 11.

Although, in the example illustrated in FIG. 2, the lower electrode of the anti-fuse element 11 is connected to the drain of the third transistor MD1, the upper electrode of the anti-fuse element 11 may be connected to the drain of the third transistor MD1 and the lower electrode thereof may be connected to the high voltage VH.

The gate oxide film 104 can be formed in the gate oxide film forming process of the first transistor MP1 and the second transistor MN1 which constitute a low-voltage logic circuit. The electrodes 105a and 105b can be made of, for example, a polysilicon layer. The polysilicon layer, the high concentration N-type diffusion regions 106a to 106c, and the high concentration P-type diffusion region 107 can be formed in the same process as the forming process of the corresponding elements of the first transistor MP1 and the second transistor MN1 which constitute the low-voltage logic circuit.

If an anti-fuse element having the MOS structure is used as the anti-fuse element 11 and a MOS transistor is used as a transistor for controlling the writing in the anti-fuse element 11 in this way, the anti-fuse element 11 and the transistor can be formed in the same process. This makes it possible to form a semiconductor device at a low cost with a small number of processes.

Insulation films provided with a plurality of contact parts 108 are formed on the high concentration P-type diffusion region 107, the N-type diffusion regions 106a to 106c, and the field oxide 103. Metal wirings 109a to 109d are provided on the insulation film. If the metal wirings 109a to 109d and electrodes are electrically connected, the manufacturing method and structure are not limited thereto.

Although, in the example illustrated in FIG. 2, the anti-fuse element 11 is a capacitance having the upper and lower electrodes formed of the polysilicon layer 105b and the N-well region 102b, respectively, the structure of the anti-fuse element 11 is not limited thereto. The anti-fuse element 11 may be, for example, a capacitance using a PMOS transistor.

The connecting state of each electrode will be described below.

The metal wiring 109a is connected to the source electrode and the back gate electrode of the third transistor MD1 via the contact parts 108, and is given the GND potential.

The metal wiring 109b is connected to the gate electrode 105a of the third transistor MD1 via the contact part 108. The output signal Vg of the inverter circuit illustrated in FIG. 1 is input to the gate electrode 105a. The metal wiring 109c is connected to the drain electrode of the third transistor MD1 and the lower electrode of the anti-fuse element 11 via the contact parts 108. The metal wiring 109d is connected to the upper electrode of the anti-fuse element 11 via the contact part 108. The high voltage VH is applied to the upper electrode of the anti-fuse element 11 at the time of information writing.

The write operation will be described below.

When writing information in the anti-fuse element 11, the third transistor MD1 that is a high-voltage NMOS transistor is turned ON by inputting a low-level signal as the control signal Sig. Then, the high voltage VH is applied to the two electrodes (the upper and the lower electrodes) of the anti-fuse element 11. This causes dielectric breakdown of the gate oxide film 104 between the two electrodes, and information is written in the anti-fuse element 11. More specifically, the anti-fuse element 11 becomes a resistive element after writing although it is a capacitive element before writing.

Therefore, as a method for reading information written in the anti-fuse element 11, there is a method for measuring impedance variation of the anti-fuse element 11.

Information to be recorded in the anti-fuse element 11 is product-specific information such as a chip ID and setting parameters. These pieces of information are written, for example, by using an inspection machine at a factory at the time of shipment. Alternatively, in a case where the anti-fuse element 11 is mounted on the main unit of a product and a user writes information in it after starting the use of the product, a voltage equivalent to the high voltage VH is supplied from the main unit of the product.

Meanwhile, in the product manufacturing process or during a user operation, a very large surge current may possibly enter the semiconductor device from the power source terminal A due to ESD. When such a large surge current enters, for example, the anti-fuse element 11 in the semiconductor device, the anti-fuse element 11 is brought into a conductive state, whereby possibly changing recorded information.

In the present embodiment, providing the resistive element Rs between the node B (at which the power source terminal A and the ESD protection element EP are connected) and the semiconductor device 1 enables releasing through the ESD protection element EP the surge current which has entered the power source terminal A. Therefore, it becomes possible to prevent the surge current from flowing into the capacitance Ca (the anti-fuse element 11). This enables restricting or preventing information written in the capacitance Ca (the anti-fuse element 11) from being changed by ESD.

Further, by using, as the resistive element Rs, a resistive element of which the resistance value having a voltage dependency increases with the increase of the voltage applied to the resistive element Rs, it becomes possible to reduce adverse effects on normal operation and effectively protect against ESD.

A second exemplary embodiment will be described below. The following describes an example for improving to a further extent the resistance against a high surge voltage due to ESD described in the first exemplary embodiment. The semiconductor device has a similar circuit configuration to that illustrated in FIG. 1.

To prevent the anti-fuse element 11 from being destroyed by a high surge voltage due to ESD, it is desirable that a surge current flows in the ESD protection element EP on a preferential basis rather than in the anti-fuse element 11. Therefore, it is desirable that the resistive element Rs has a high resistance value. On the other hand, if the resistive element Rs has a high resistance value, the stability of gate oxide destruction of the anti-fuse element 11 is impaired in a normal write operation. Further, at the time of a read operation, it is desirable that there are few resistance components other than resistance components of the anti-fuse element 11 after writing.

Therefore, it is desirable that the resistive element Rs provides a low resistance value at the time of normal operations such as writing and reading on the anti-fuse element 11 and provides a high resistance at the time of application of a voltage largely exceeding the voltage range for normal operations, such as a surge voltage due to ESD. Further, if a resistive element of which the resistance value monotonically increases and the rate of increase in the resistance also monotonically increases with increasing applied voltage is used as the resistive element Rs, it is possible to allow the ESD protection element to more effectively function while reducing restriction of normal operations as a semiconductor device.

Figure 3:
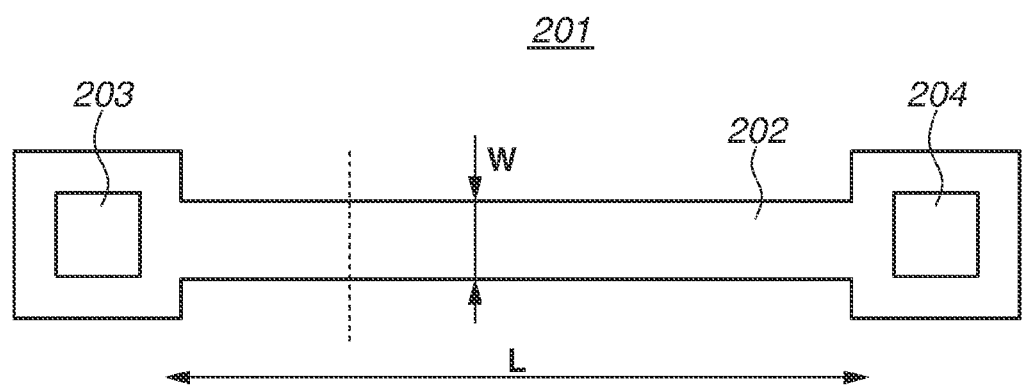
FIG. 3 illustrates an example of a configuration of a resistive element according to a second exemplary embodiment in accordance with one or more aspect of the present disclosure.
Figure 4:
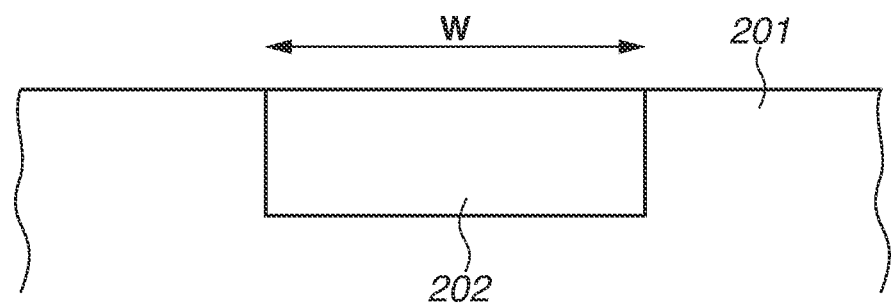
FIG. 4 is a sectional view illustrating a portion of the resistive element indicated by a broken line illustrated in FIG. 3 in accordance with one or more aspect of the present disclosure.

FIG. 3 is a plan view illustrating an example of the resistive element Rs according to one or more aspect of the present embodiment. The resistive element Rs according to the present exemplary embodiment is a diffusion resistor in which an N-type diffusion resistance region 202 is produced in a P-type silicon substrate 201. The resistive element Rs has a first connection region 203 and a second connection region 204 in addition to the N-type diffusion resistance region 202. FIG. 4 is a sectional view illustrating the resistive element Rs taken along a broken line illustrated in FIG. 3. With this structure, the resistance value changes with the magnitude of the voltage applied to the N-type diffusion resistance region 202. This resistance variation is caused by the fact that, when a depletion layer region generated in the junction between the N-type diffusion resistance region 202 and the P-type silicon substrate 201 changes, the width of the depletion layer region also changes and accordingly a width of a range that substantially functions as a resistance changes. When a high voltage is applied to the N-type diffusion resistance region 202, the width of the range that substantially functions as a resistance decreases.

Figure 5:
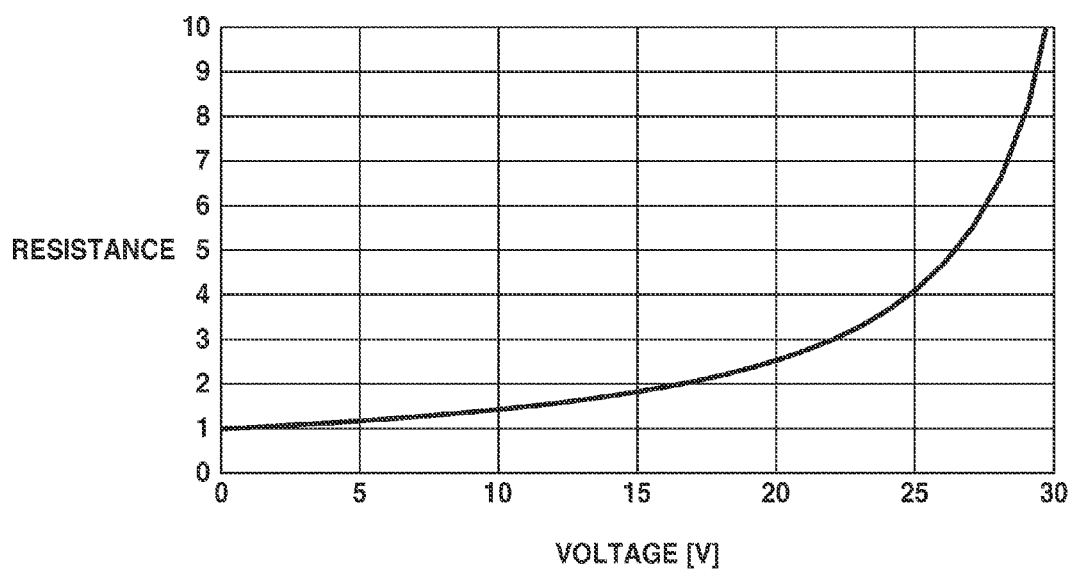
FIG. 5 illustrates a voltage dependency of the resistive element according to the second exemplary embodiment in accordance with one or more aspect of the present disclosure.

FIG. 5 illustrates the voltage applied to the N-type diffusion resistance region 202 and the resistance value of the resistive element Rs. FIG. 5 is a graph in which the resistance values of the resistive element Rs is normalized by the resistance value thereof at the voltage 0 V. In the present embodiment, a voltage of 20 V is applied to the power source terminal A at the time of information writing in the anti-fuse element 11. As illustrated in FIG. 5, in a case where a large surge current enters the power source terminal A, the voltage rises by the resistive element Rs itself and accordingly the resistance value of the resistive element Rs rises. In this case, the resistance value of the resistive element Rs monotonically increases and the rate of increase in the resistance also monotonically increases with increasing applied voltage.

Therefore, at the time of a normal write operation and a normal read operation, the resistive element Rs provides a low resistance making it possible to reduce effects on the stability of a write operation and on a read operation. In addition, if a surge voltage occurs due to ESD, the resistance of the resistive element Rs monotonically increases and the rate of increase in the resistance also monotonically increases, and therefore a surge current flows in the protection element EP on a preferential basis rather than in the anti-fuse element 11.

Therefore, it is possible to reduce the possibility that the anti-fuse element 11 is destroyed by a surge current if a surge voltage occurs. More specifically, in comparison with a case where a resistor having a constant resistance is used as the resistive element Rs, the resistive element Rs according to the present embodiment enables improving the surge resistance of the anti-fuse element 11.

As described above, using the resistive element according to the present embodiment as the resistive element Rs enables more stably and efficiently performing normal write and read operations of the semiconductor device 1 and more reliably protecting the semiconductor device 1 using an ESD protection element.

Figure 6:
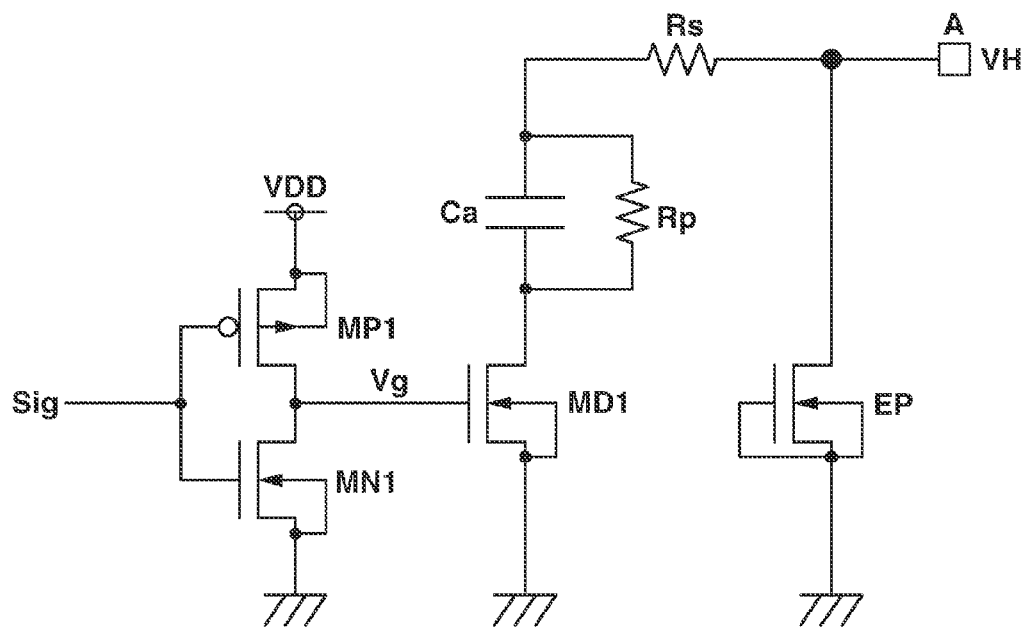
FIG. 6 illustrates an example of a circuit of a semiconductor device according to a third exemplary embodiment in accordance with one or more aspect of the present disclosure.

A third exemplary embodiment will be described below. The following describes an example for improving to a further extent the resistance to a high surge voltage due to ESD described in the second exemplary embodiment. FIG. 6 illustrates an example of a circuit configuration of the semiconductor device 1.

As illustrated in FIG. 6, in addition to the resistive element Rs (first resistive element), the circuit according to the present embodiment is further provided with a resistive element Rp (second resistive element) in parallel with the anti-fuse element 11. In a case where the high-voltage NMOS transistor MD1 is OFF, the resistive element Rp has an effect of equalizing the potentials at both terminals of the capacitance Ca (the anti-fuse element 11), thus improving the anti-surge resistance. The resistive element Rp having a lower resistance value provides a larger effect of equalizing the potentials at both terminals. In the present embodiment, the resistive elements Rs and Rp may be configured, for example, by using diffusion resistors having the structures illustrated in FIGS. 3 and 4. The relation between a width Wrs of the resistive element Rs and a width Wrp of the resistive element Rp is given by the following formula.

$$Wrs < Wrp \quad \text{(Formula 1)}$$

The width Wrs of the resistive element Rs is the length of a region which functions as a resistive element in the resistive element Rs in the direction perpendicular to the electric path (current path). The width Wrp of the resistive element Wpp is the length of a region which functions as a resistive element in the resistive element Rp in the direction perpendicular to the electric path (current path).

Figure 7:
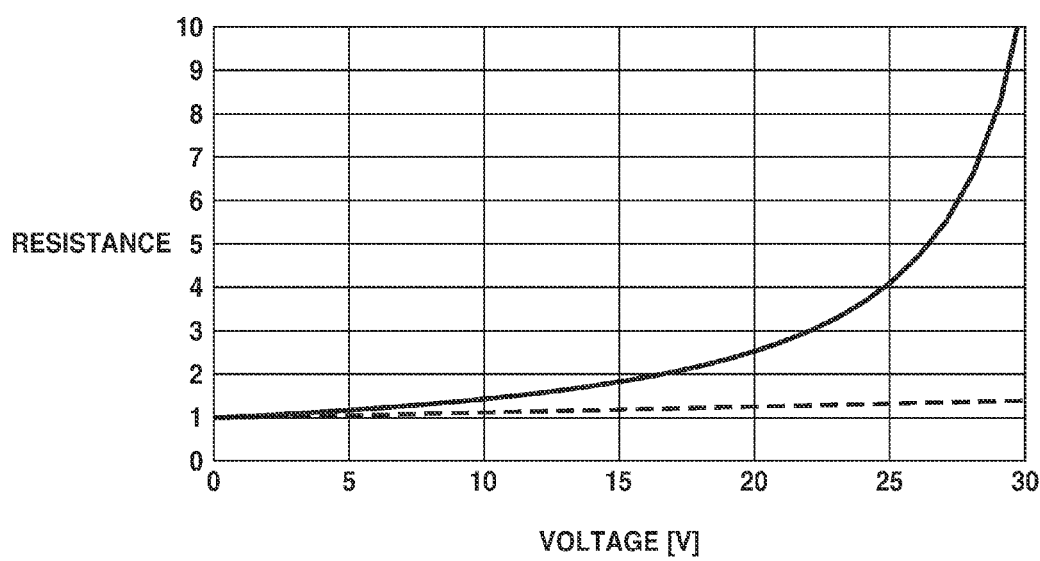
FIG. 7 illustrates a voltage dependency of a resistive element according to the third exemplary embodiment in accordance with one or more aspect of the present disclosure.

When the width of the resistive element Rs is made narrower than that of the resistive element Rp, the voltage dependency of the resistance of the resistive element Rs becomes higher than that of the resistive element Rp. FIG. 7 illustrates the voltage applied to the N-type diffusion resistance region 202 in the horizontal axis and the values, in the vertical axis, obtained by normalizing the resistive elements Rs and Rp by the resistance values thereof when substantially no voltage is applied. A solid line indicates the resistance value of the resistive element Rs, and a broken line indicates the resistance value of the resistive element Rp. Adjusting a width W of a range that functions as a resistance to achieve the relation of the formula 1 enables differentiating the voltage dependency between the resistive elements Rs and Tp. In the present embodiment, a voltage of 20 V is applied to the power source terminal A at the time of information writing in the anti-fuse element 11.

When a voltage higher than the write-in voltage is applied to the power source terminal A, the resistance value of the resistive element Rs becomes higher than that at the time of write-in voltage application, whereby improving the surge resistance. Further, even when a voltage higher than the write-in voltage is applied to the power source terminal A, the resistance value of the resistive element Rp does not largely increase. This maintains the effect of equalizing the potentials at both terminals of the capacitance Ca (the anti-fuse element 11), thereby further improving the surge resistance. Further, configuring the resistive elements Rs and Rp to have the same structure enables preventing an increase in process cost.

A high-voltage MOS transistor, for example, a high-voltage NMOS transistor can be used as an ESD protection element EP illustrated in FIG. 6. The gate, the source, and the back gate of the high-voltage NMOS transistor (the ESD protection element EP) are connected to the ground, and the drain thereof is connected between the power source terminal A and the resistive element Rs. This makes it possible to release a larger current than a diode does, by using the breakdown and snap back operations of the high-voltage NMOS transistor. Using the same structure as the high-voltage NMOS transistor MD1 as an ESD protection element enables preventing an increase in process cost.

A fourth exemplary embodiment will be described below. The present embodiment will be described below centering on an example in which the semiconductor device 1 is applied to a recording device as an example of application of the semiconductor device 1 according to any one of the first to the third exemplary embodiments.

Figure 8:
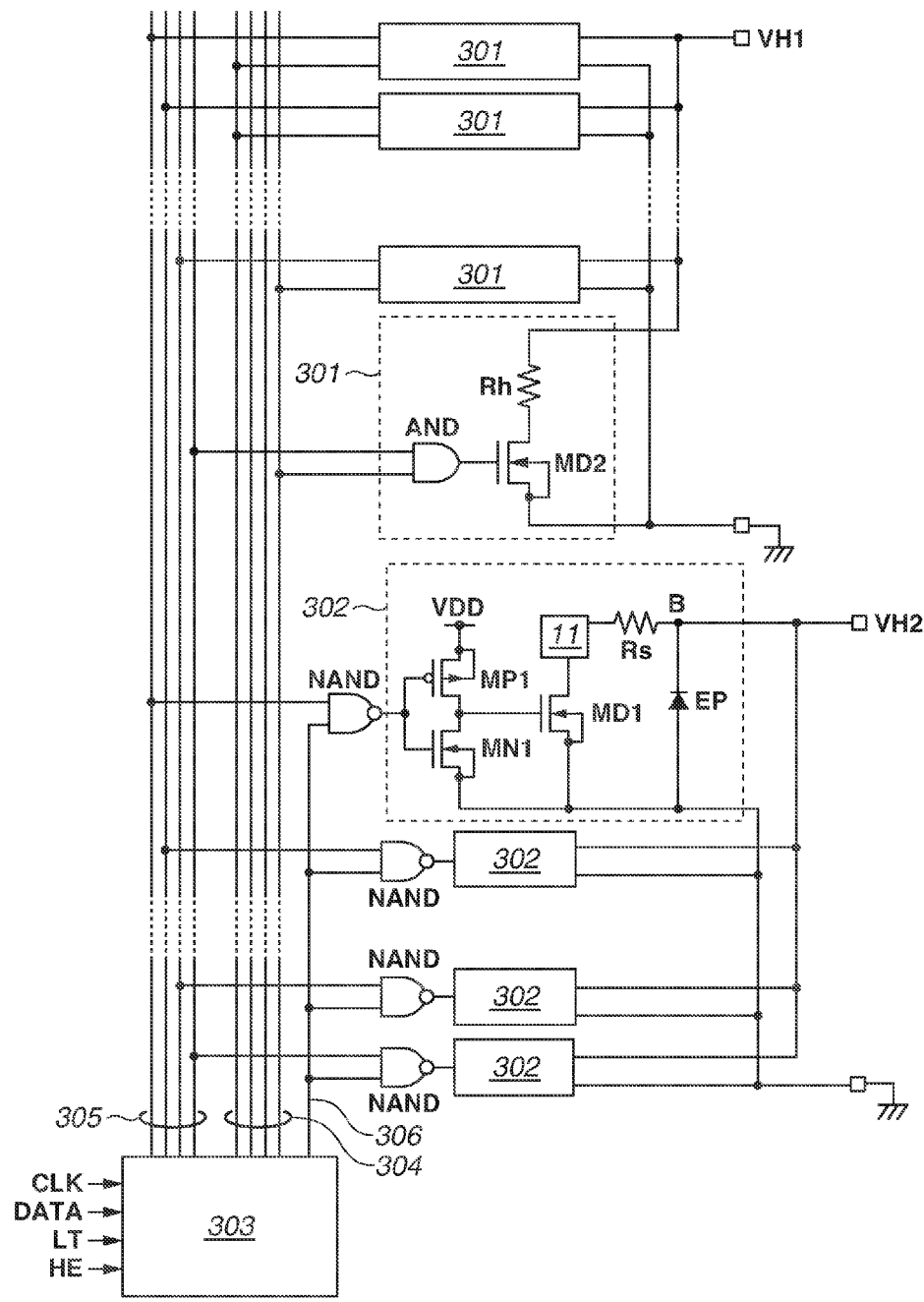
FIG. 8 illustrates an example of a recording head substrate having a semiconductor device in accordance with one or more aspect of the present disclosure.

FIG. 8 illustrates an example of a circuit configuration of a recording head substrate having the semiconductor device 1 according to any one of the first to the third exemplary embodiments. The recording head substrate includes memory units 302, NAND logic circuits NAND, and recording units 301.

Each memory unit 302 includes an inverter composed of the first transistor MP1 and the second transistor MN1, the third transistor MD1, the anti-fuse element 11, the resistive element Rs, the node B, and the ESD protection element EP. The recording unit 301 includes a heater Rh (electrothermal conversion element) and a drive unit (for example, a transistor MD2 and an AND logic circuit AND) for driving the heater Rh. Driving the heater Rh, i.e., generating heat by turning on the heater Rh enables discharging a recording agent to perform recording.

A control circuit 303 includes, for example, a shift register and a latch circuit (not illustrated). A clock signal CLK, an image data signal DATA, a latch signal LT, and a heater control signal HE may be input to the control circuit 303, for example, via a host personal computer (PC) (not illustrated). The AND logic circuits AND, the NAND logic circuits NAND, and the control circuit 303 are supplied with a first power voltage $V_{DD}$ (for example, 3 to 5 V) as a power voltage for logic operations. Therefore, the heater Rh of the recording units 301 and the memory unit 302 (semiconductor device) are electrically connected to the control circuit 303.

For example, for m groups each having n recording units 301, the control circuit 303 is able to perform, for each group, time-division driving of the heater Rh by controlling operations of the recording unit 301. The control circuit 303 can perform time-division driving by outputting an m-bit block selection signal 304 and an n-bit time-division selection signal 305.

When the corresponding block selection signal 304 and time-division selection signal 305 are input to the AND logic circuits AND, the transistor MD2 turns on, in response to the input signals, to drive the heater Rh connected with the transistor MD2 in series. The recording unit 301 is supplied with a second power voltage VH1 (for example, 24 V) as a power voltage for driving the heater Rh and the ground potential is the GND potential.

A control signal 306 and the time-division selection signal 305 are input to the NAND logic circuits NAND. The inverter outputs signals corresponding to these signals to the transistor MD1 to switch between the conducting and the non-conducting states of the transistor MD1. The semiconductor device 1 is supplied with a third power voltage VH2 for writing information in the anti-fuse element 11 and the ground potential is the GND potential.

Figure 9:
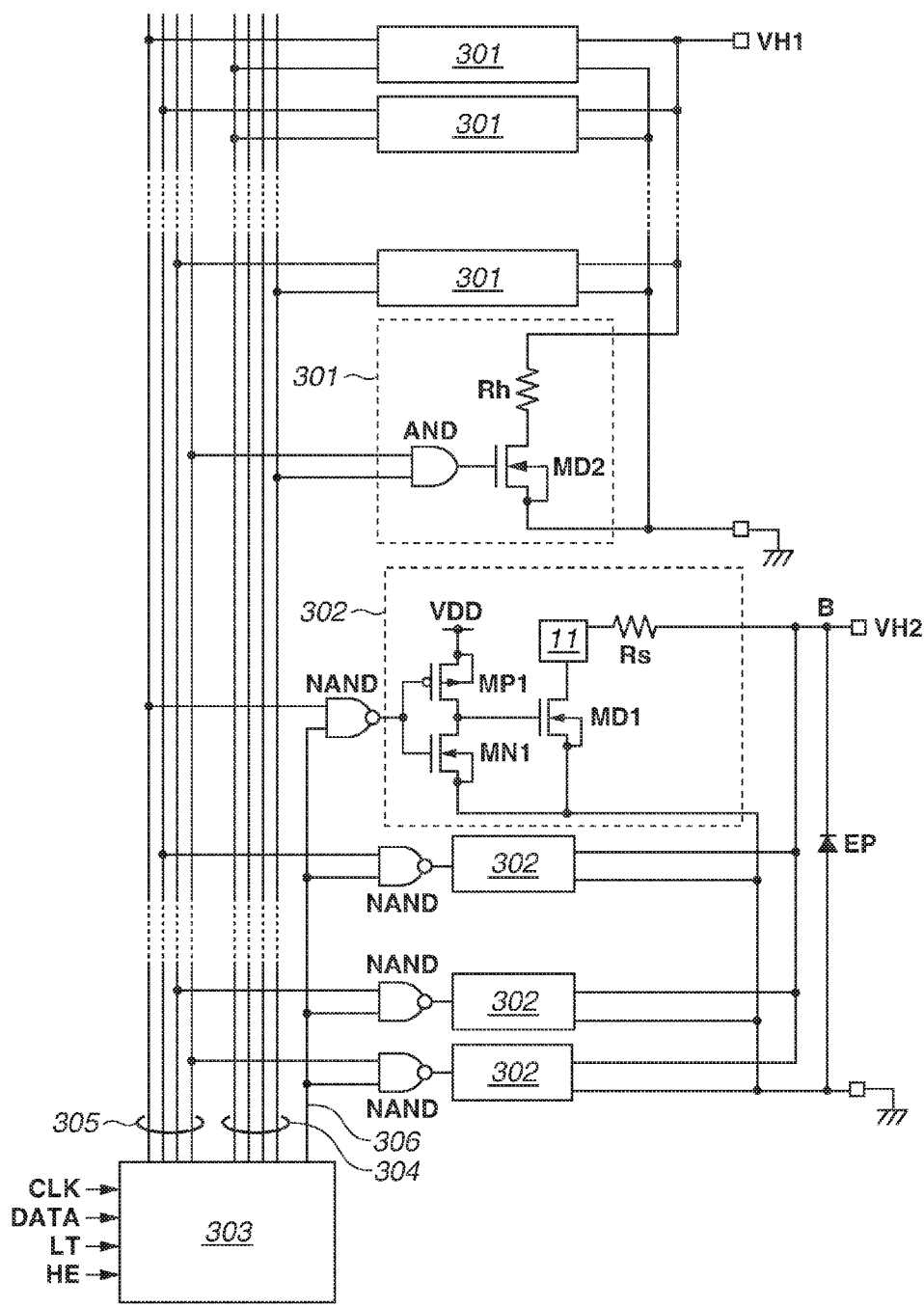
FIG. 9 illustrates another example of a recording head substrate having a semiconductor device in accordance with one or more aspect of the present disclosure.

Although, in the example illustrated in FIG. 8, the ESD protection element EP is disposed in each of the memory units 302, at least one ESD protection element may be disposed between the VH2 terminal and the grounding terminal, as illustrated in FIG. 9. In this case, each of the memory units 302 does not include the ESD protection element EP but include, for example, the inverter, the third transistor MD1, the anti-fuse element 11, and the resistive element Rs.

Although, in the examples illustrated in FIGS. 8 and 9, both the recording unit 301 and the memory units 302 are connected to the control circuit 303, these units may be connected to respectively different control circuits.

Figure 10:
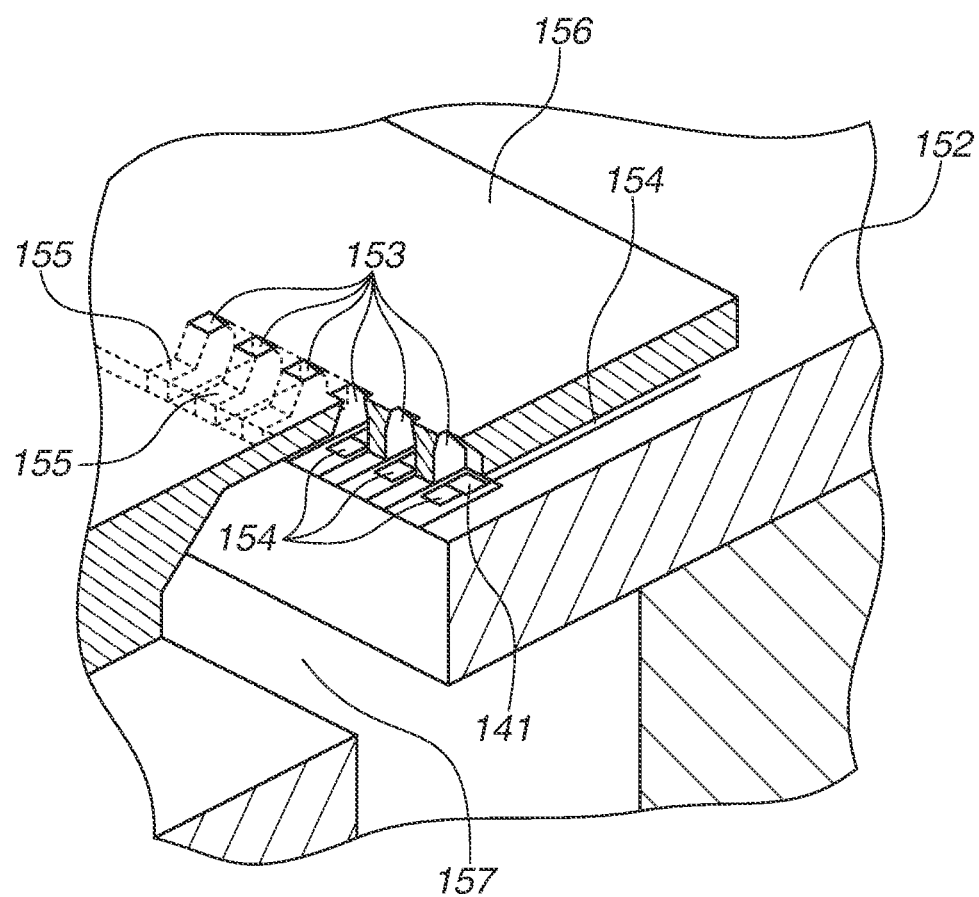
FIG. 10 illustrates a part of a configuration example of a recording head substrate and an ink supply unit in accordance with one or more aspect of the present disclosure.
Figure 11:
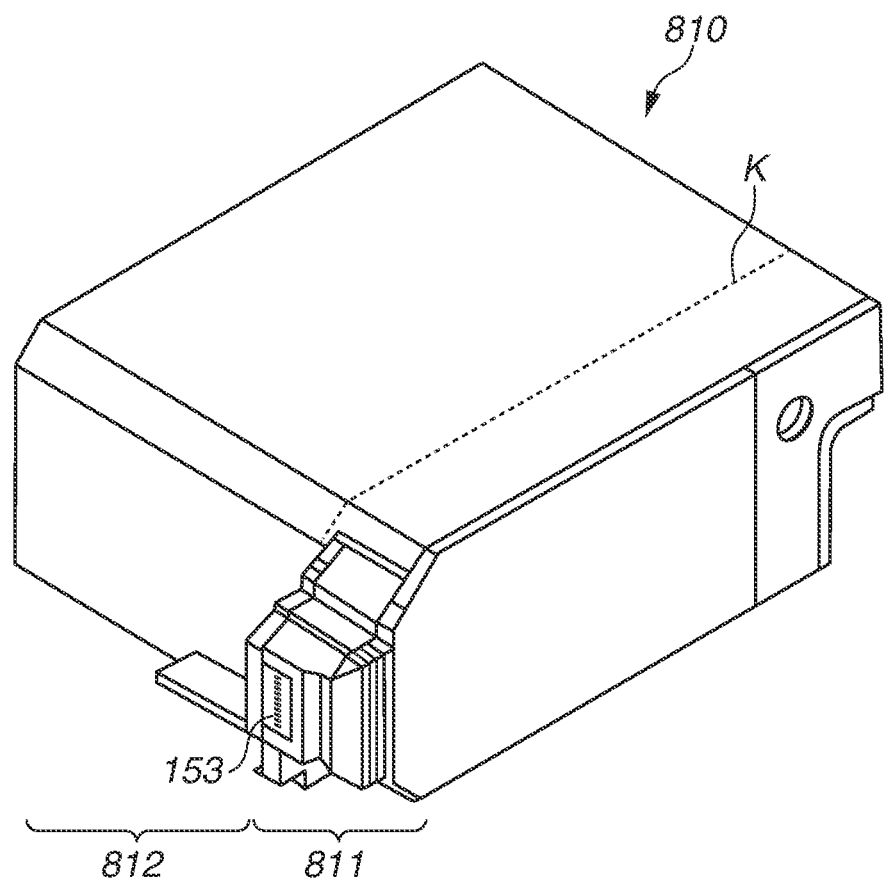
FIG. 11 illustrates a part of a configuration example of a recording head in accordance with one or more aspect of the present disclosure.
Figure 12:
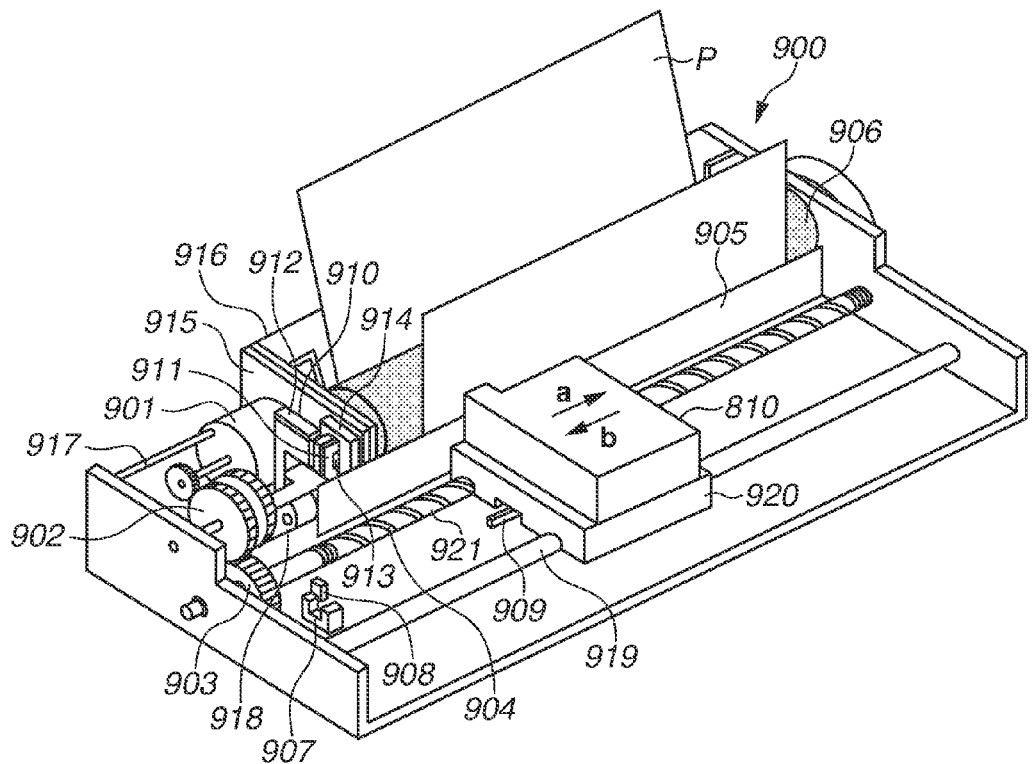
FIG. 12 illustrates a configuration example of a recording device in accordance with one or more aspect of the present disclosure.

The following describes with reference to FIGS. 10 to 12 an example in which the above-described recording head substrate for a recording head of the ink-jet recording type is mounted on a recording device. However, the recording device is not limited to this form. For example, melting type and sublimation type thermal transfer recording devices are also applicable. The recording device may be, for example, a single function printer having only a recording function or a multifunction printer having a plurality of functions such as a recording function, a FAX function, and a scanner function. Further, the recording device may be a manufacturing apparatus for manufacturing, for example, color filters, electronic divides, optical devices, minute structures, and the like, with predetermined recording processes.

"Recording" may include not only forming an actualized matter that can be visually perceived by humans, such as an image, a design, a pattern, a structure, and the like, on a recording medium but also processing a medium. A "recording medium" may include not only paper used in typical recording devices but also cloths, plastic films, metal plates, glasses, ceramics, resins, woods, leathers, and the like, to which a recording agent can be applied. A "recording agent" may include not only liquids such as ink which is provided for forming an image, a design, a pattern, and the like, or for processing a recording medium by adhering thereto but also liquids which is provided for processing a recording agent (for example, for solidifying or insolubilizing a coloring material contained in the recording agent).

FIG. 10 schematically illustrate a part of a configuration example of a recording head substrate 152 for a recording head of the ink-jet recording type and an ink supply unit according to the present exemplary embodiment. The recording head substrate 152 has a plurality of heaters 141 (electrothermal conversion elements) disposed to respectively correspond to nozzles 153 (discharge nozzles) for discharging ink. When the heaters 141 are driven, ink is heated and foamed, and then the ink is discharged from the nozzles 153. For example, the recording head substrate described with reference to FIG. 8 can be used as the recording head substrate 152.

Electrodes 154 for turning on the heaters 141 may be electrically connected, for example, to driving elements for driving the heaters 141. Respective nozzles 153 are connected to a common liquid chamber 157 via corresponding ink flow paths 155 so that the nozzles 153 are supplied with ink to be discharged. A member 156 is internally provided with grooves to form the nozzles 153, the flow paths 155, and the common liquid chamber 157.

Although the recording head substrate 152 discharges ink by heating it by using the heaters 141 as an example, the recording head substrate according to the present disclosure is not limited thereto. For example, instead of the heaters 141, piezoelectric elements may be used as discharge elements.

FIG. 11 illustrates an example of an outer appearance of a recording head 810. The recording head 810 may include a recording head unit 811 (having the plurality of nozzles 153 and the recording head substrate 152), and an ink tank 812 attached to the recording head unit 811. The ink tank 812 stores ink to be supplied to the recording head unit 811. The ink tank 812 and the recording head unit 811 can be separated at a broken line K to allow the replacement of the ink tank 812.

The recording head 810 is provided with an electrical contact (not illustrated) for receiving an electrical signal from a carriage 920 (FIG. 12) and discharges ink following the electrical signal to perform the above-described recording. The ink tank 812 has, for example, a fibrous or porous ink holding member (not illustrated) which can hold ink.

FIG. 12 is a bird's-eye view illustrating a recording device 900. The recording head 810 which is partially illustrated in FIG. 11 is mounted on the carriage 920 together with the ink tank 812 (recording agent container). The carriage 920 is attached to a lead screw 904 having a spiral groove 921. The rotation of the lead screw 904 allows the recording head 810 to move along a guide 919 together with the carriage 920 in the direction indicated by an arrow a or b. The rotation of the lead screw 904 is associated with the rotation of a drive motor 901 via driving force transfer gears 902 and 903.

Recording paper P is conveyed onto a platen 906 by a conveyance unit (not illustrated). A paper pressing plate 905 presses down the recording paper P onto the platen 906 along the moving direction of the carriage 920. The recording device 900 confirms, via photocouplers 907 and 908, the position of a lever 909 provided on the carriage 920 and changes the rotational direction of the drive motor 901. A supporting member 910 supports a cap member 911 for capping each nozzle of the recording head 810. A suction unit 912 sucks the inside of the cap member 911 and performs suction recovery processing on the recording head 810 via an opening 913 inside the cap member 911.

A known cleaning blade is used as a cleaning blade 914. A moving member 915 moves the cleaning blade 914 in an anteroposterior direction. A main unit supporting plate 916 supports a moving member 915 and the cleaning blade 914. A lever 917 is provided to start the suction recovery processing.

The lever 917 moves with the movement of a cam 918 engaging with the carriage 920. The driving force from the drive motor 901 may be controlled by a known transmission means such as a clutch mechanism. The recording device 900 is provided with a recording control unit (not illustrated), and controls each mechanism according to electrical signals such as record data from the outside. The recording device 900 repeats the reciprocal movement of the recording head 810 and the conveyance of the recording paper P by a conveyance unit (not illustrated) to complete recording on the recording paper P.

The above-described recording device 900 has three-dimensional (3D) data, and can be used as an apparatus for forming a three-dimensional image.

As described above, applying the semiconductor device 1 according to any one of the first to the third exemplary embodiments to a recording device enables restraining or preventing information in an anti-fuse memory from being changed by ESD and enables improving the reliability of the recording device.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-249092, filed Dec. 21, 2015, which is hereby incorporated by reference in its entirety.

What is claimed is:

1. A semiconductor device comprising:
an anti-fuse element;
a transistor connected, via the anti-fuse element, to a power source terminal which is for applying a voltage to the anti-fuse element;
an electro-static discharge (ESD) protection element connected to the power source terminal via a node; and
a first resistive element disposed in an electric path between the node and the anti-fuse element,
wherein a resistance value of the first resistive element increases with an increase of a voltage applied to the first resistive element.

2. The semiconductor device according to claim 1, wherein the anti-fuse element has a metal-oxide semiconductor (MOS) structure and is configured so that information is written therein through a dielectric breakdown of a gate oxide film of the MOS structure.

3. The semiconductor device according to claim 1, wherein the transistor is a MOS transistor.

4. The semiconductor device according to claim 1, further comprising:
a MOS transistor; and
a drive unit configured to drive the transistor.

5. The semiconductor device according to claim 1, wherein, when the voltage applied to the first resistive element increases, the resistance value of the first resistive element monotonically increases and a rate of increase in the resistance value also monotonically increases.

6. The semiconductor device according to claim 1, further comprising:
a second resistive element connected in parallel to the anti-fuse element,
wherein, when a voltage higher than a voltage applied to the power source terminal at the time of information writing in the anti-fuse element is applied, the rate of increase in the resistance value of the first resistive element is larger than a rate of increase in a resistance value of the second resistive element.

7. The semiconductor device according to claim 6, wherein the first and the second resistive elements are diffusion resistors.

8. The semiconductor device according to claim 7, wherein a width of the second resistive element is larger than a width of the first resistive element.

9. The semiconductor device according to claim 7, wherein, in each of the first and the second resistive elements, a region to be a depletion layer region in a diffusion region where the diffusion resistor is formed is changed by an applied voltage, and a width of a region that substantially functions as a resistor decreases when a high voltage is applied.

10. The semiconductor device according to claim 1, wherein the ESD protection element includes a MOS transistor of which a gate, a source, and a back gate are connected to a ground, and a drain is connected to the node between the power source terminal and the first resistive element.

11. A recording device comprising:
a recording head unit having discharge nozzles and a recording head substrate; and
an ink tank attached to the recording head unit,
wherein the recording head substrate comprises:
discharge elements each of which corresponds to a different one of the discharge nozzles;
a control circuit electrically connected to the discharge elements; and
the semiconductor device electrically connected to the control circuit, wherein the semiconductor device comprises:
an anti-fuse element;
a transistor connected, via the anti-fuse element, to a power source terminal which is for applying a voltage to the anti-fuse element;
an electro-static discharge (ESD) protection element connected to the power source terminal via a node; and
a first resistive element disposed in an electric path between the node and the anti-fuse element,
wherein a resistance value of the first resistive element increases with an increase of a voltage applied to the first resistive element.

12. A semiconductor device comprising:
an anti-fuse element;
a transistor of which either one of a source and a drain is connected to one terminal of the anti-fuse element and the other one of the source and the drain is supplied with a first potential;
a first resistive element of which one terminal is connected to the other terminal of the anti-fuse element and the other terminal is connected to a power source terminal supplied with a second potential different from the first potential; and
an ESD protection element connected to an electric path between the power source terminal and the other terminal of the first resistive element,
wherein the first resistive element is a diffusion resistor.

13. The semiconductor device according to claim 12, wherein the anti-fuse element has a MOS structure and is configured so that information is written therein through a dielectric breakdown of a gate oxide film of the MOS structure.

14. The semiconductor device according to claim 12, wherein the transistor is a MOS transistor.

15. The semiconductor device according to claim 12, further comprising:
a MOS transistor; and
a drive unit configured to drive the transistor.

16. The semiconductor device according to claim 12, wherein, when the voltage applied to the first resistive element increases, the resistance value of the first resistive element monotonically increases and a rate of increase in the resistance value also monotonically increases.

17. The semiconductor device according to claim 12, further comprising:
 a second resistive element connected in parallel to the anti-fuse element,
 wherein, when a voltage higher than a voltage applied to the power source terminal at the time of information writing in the anti-fuse element is applied, the rate of increase in the resistance value of the first resistive element is larger than a rate of increase in a resistance value of the second resistive element.

18. The semiconductor device according to claim 12, wherein a width of the second resistive element is larger than a width of the first resistive element.

19. The semiconductor device according to claim 12, wherein, in the first resistive element, a region to be a depletion layer region in a diffusion region where the diffusion resistor is formed is changed by an applied voltage, and a width of a region that substantially functions as a resistor decreases when a high voltage is applied.

20. The semiconductor device according to claim 12, wherein the ESD protection element includes a MOS transistor of which a gate, a source, and a back gate are connected to a ground, and a drain is connected between the power source terminal and the first resistive element.

21. A recording device comprising:
 a recording head unit having discharge nozzles and a recording head substrate; and
 an ink tank attached to the recording head unit,
 wherein the recording head substrate comprises:
 discharge elements each of which corresponds to a different one of the discharge nozzles;
 a control circuit electrically connected to the discharge elements; and
 the semiconductor device according to claim 12 electrically connected to the control circuit.

22. A semiconductor device comprising:
 an anti-fuse element;
 a transistor of which either one of a source and a drain is connected to one terminal of the anti-fuse element and the other one of the source and the drain is supplied with a first potential;
 a first resistive element of which one terminal is connected to the other terminal of the anti-fuse element and the other terminal is connected to a power source terminal supplied with a second potential different from the first potential; and
 an ESD protection element connected to an electric path between the power source terminal and the other terminal of the first resistive element,
 wherein a resistance value of the first resistive element increases with an increase of a voltage applied to the first resistive element.

\* \* \* \* \*